United States Patent
Ohnishi

(10) Patent No.: US 10,665,460 B2
(45) Date of Patent: May 26, 2020

(54) VAPOR PHASE GROWTH APPARATUS, METHOD OF MANUFACTURING EPITAXIAL WAFER, AND ATTACHMENT FOR VAPOR PHASE GROWTH APPARATUS

(71) Applicant: SHIN-ETSU HANDOTAI CO., LTD., Tokyo (JP)

(72) Inventor: Masato Ohnishi, Fukushima (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/325,360

(22) PCT Filed: Jul. 6, 2017

(86) PCT No.: PCT/JP2017/024822
§ 371 (c)(1),
(2) Date: Feb. 13, 2019

(87) PCT Pub. No.: WO2018/042877
PCT Pub. Date: Mar. 8, 2018

(65) Prior Publication Data
US 2019/0206685 A1    Jul. 4, 2019

(30) Foreign Application Priority Data
Sep. 5, 2016   (JP) .................................. 2016-172803

(51) Int. Cl.
*H01L 21/205* (2006.01)
*C23C 16/455* (2006.01)
*H01J 37/32* (2006.01)

(52) U.S. Cl.
CPC .......... *H01L 21/205* (2013.01); *C23C 16/455* (2013.01); *C23C 16/45502* (2013.01);
(Continued)

(58) Field of Classification Search
None
See application file for complete search history.

(56) References Cited

U.S. PATENT DOCUMENTS 6,502,530 B1    1/2003  Turlot et al.
10,381,461 B2 *  8/2019  Cho .................. H01L 29/66742
(Continued)

FOREIGN PATENT DOCUMENTS

JP    2002-75692 A    3/2002
JP    2003-168650 A   6/2003
(Continued)

OTHER PUBLICATIONS

English Translation of International Search Report (dated 2019).*
(Continued)

*Primary Examiner* — J.E. Schoenholtz
(74) *Attorney, Agent, or Firm* — Arent Fox LLP

(57) ABSTRACT

A vapor phase growth apparatus includes a reactor, a plurality of flow paths, a cap, and an attachment. The reactor has an inlet through which vapor phase growth gas is introduced therein. The plurality of flow paths extend from the inlet to the outside of the inlet 8a. The cap has an introduction passage. The attachment has a branch path connectable to the introduction passage, and is attached to the cap. The branch path is branches in a tournament-tree shape from the introduction passage side toward the downstream side of the material gas, so that the branched paths are connected to the corresponding flow paths. Thus, a vapor phase growth apparatus capable of improving uniformity of the film thickness of an epitaxial layer grown on a substrate with high cost effectiveness, is provided.

6 Claims, 5 Drawing Sheets

(52) U.S. Cl.
CPC .... *C23C 16/45587* (2013.01); *H01J 37/3244* (2013.01); *H01J 37/32623* (2013.01)

(56) References Cited

U.S. PATENT DOCUMENTS

| | | | |
|---|---|---|---|
| 2007/0122323 | A1 | 5/2007 | Yamada et al. |
| 2016/0068956 | A1* | 3/2016 | Lau .................... C23C 16/4558 137/561 A |

FOREIGN PATENT DOCUMENTS

| | | | |
|---|---|---|---|
| JP | 2004-127853 | A | 4/2004 |
| JP | 2005-183511 | A | 7/2005 |
| JP | 2005-353775 | A | 12/2005 |
| JP | 2007-12664 | A | 1/2007 |
| JP | 2009-277730 | A | 11/2009 |
| JP | 2011-23563 | A | 2/2011 |
| JP | 2011-249448 | A | 12/2011 |

OTHER PUBLICATIONS

International Search Report and Written Opinion, issued by International Searching Authority in corresponding International Application No. PCT/JP2017/024822, dated Sep. 19, 2017 (PCT/ISA/210 & PCT/ISA/237).

* cited by examiner

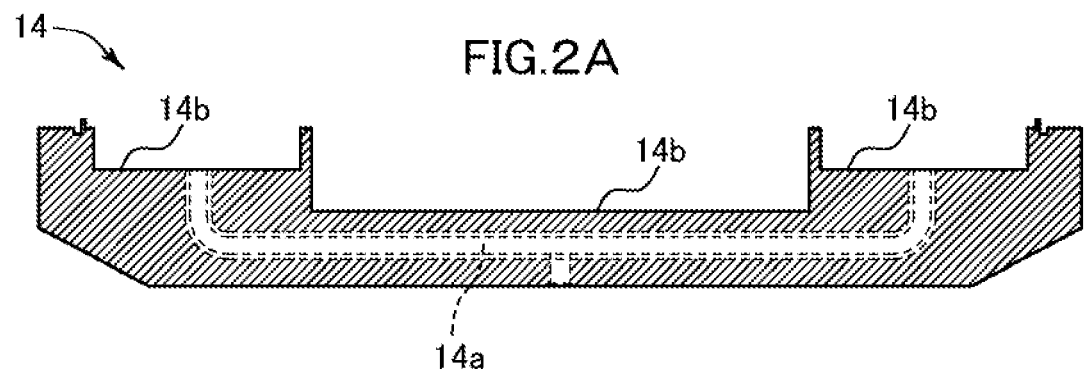
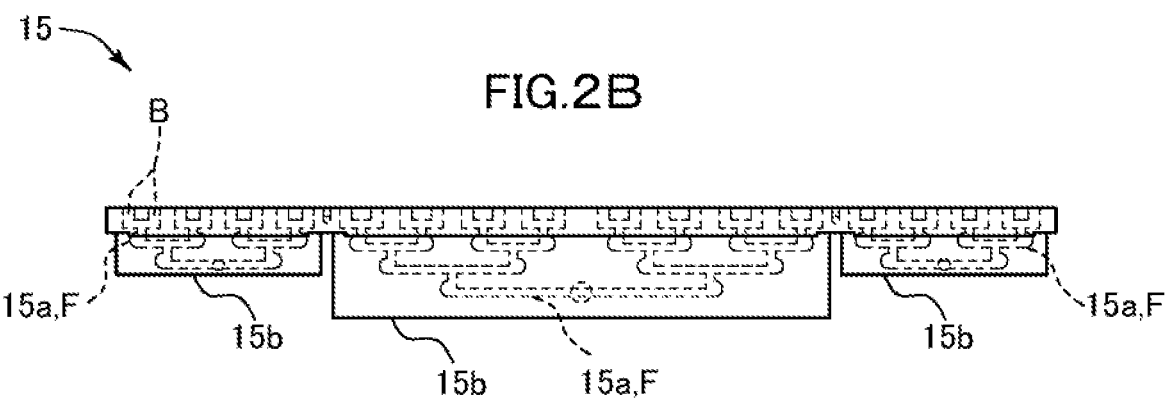
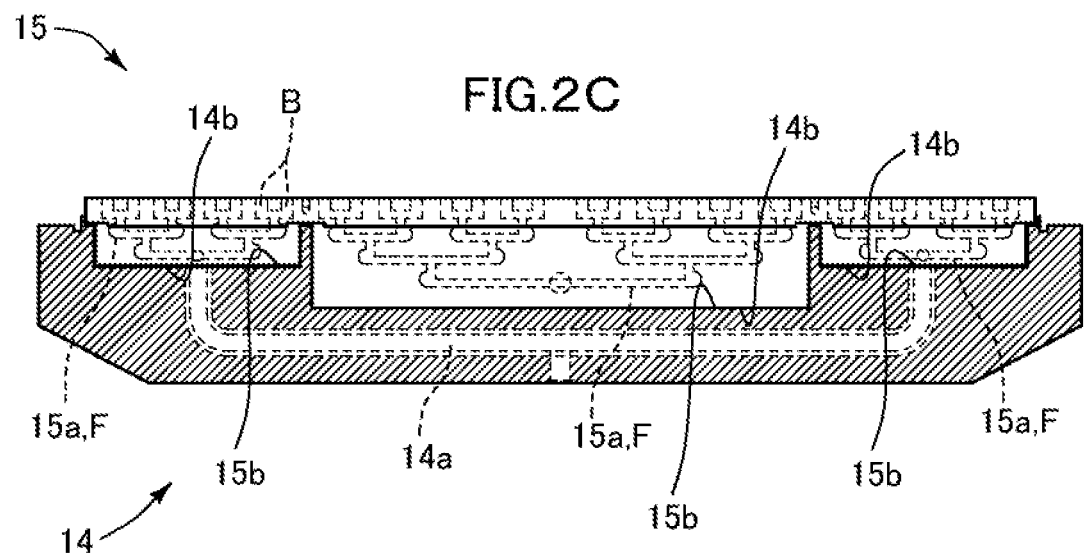

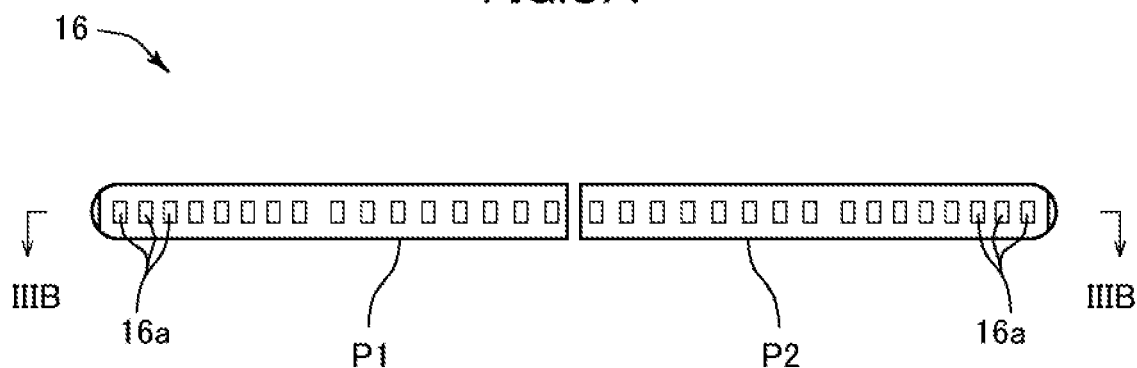
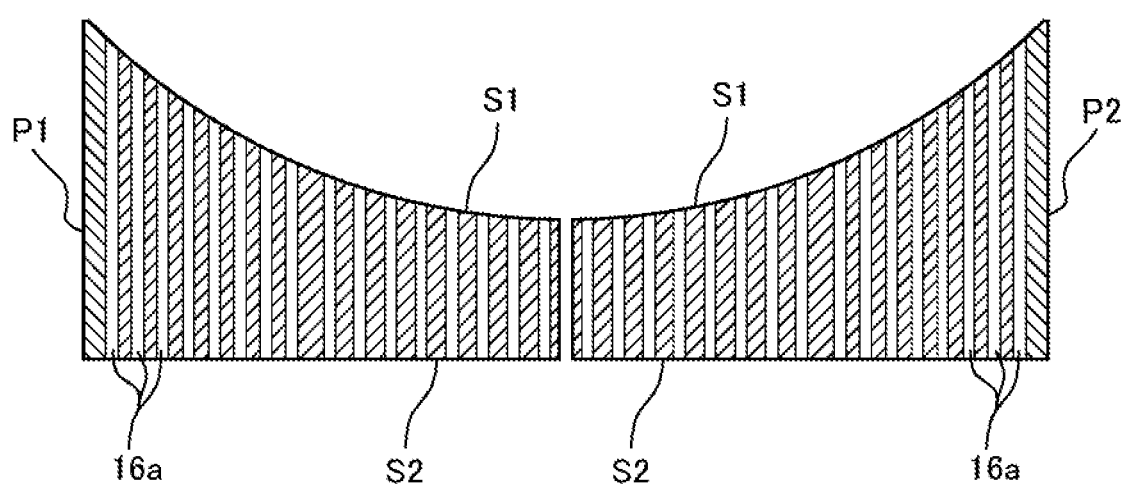

VAPOR PHASE GROWTH APPARATUS, METHOD OF MANUFACTURING EPITAXIAL WAFER, AND ATTACHMENT FOR VAPOR PHASE GROWTH APPARATUS

CROSS-REFERENCE TO RELATED APPLICATIONS

This present application is a National Stage entry of International Application No. PCT/JP2017/024822, filed Jul. 6, 2017, which claims priority to Japanese Patent Application No. 2016-172803, filed Sep. 5, 2016. The disclosures of the prior applications are incorporated by reference in their entirety.

FIELD OF THE INVENTION

This invention relates to a vapor phase growth apparatus, a method of manufacturing an epitaxial wafer, and an attachment for the vapor phase growth apparatus.

BACKGROUND OF THE INVENTION

With miniaturization of a semiconductor integrated circuit, a pattern formed on a semiconductor substrate, which is a base of the semiconductor integrated circuit, is miniaturized, and thus such a semiconductor substrate is required to have higher qualities. In particular, the requirement for flatness is particularly increased among various qualities required for semiconductor substrates. Among semiconductor substrates, an epitaxial wafer, which is suitable for various applications, needs to have both flatness of a substrate and flatness of an epitaxial layer. The flatness of the epitaxial layer significantly depends on film thickness distribution of the epitaxial layer. Therefore, in order to satisfy the required flatness of the epitaxial layer, it is necessary to improve uniformity of film thickness distribution of the epitaxial layer.

At present, a single-wafer-processing type vapor phase growth apparatus is used for manufacturing an epitaxial wafer having a diameter of 300 mm. Such a vapor phase growth apparatus is roughly composed of: a mechanism which supplies material gas for growing an epitaxial layer on a substrate; a reactor which grows an epitaxial layer on the substrate by using the supplied material gas; and a mechanism which discharges the gas from the reactor. The material gas supplying mechanism includes an injection cap (hereinafter referred to as "cap"), a baffle, and an injection insert (hereinafter referred to as "insert") in order from the upstream side of the material gas. The cap has a space through which the material gas passes when the material gas is introduced into the reactor. The baffle is a plate-shaped member sandwiched between the cap and the insert, and has a plurality of through-holes which guide the material gas in the cap to the insert. The through-holes adjust the flow of the material gas toward the insert. The insert includes a plurality of flow paths which guide the material gas having passed through the through-holes of the baffle, to an inlet to the reactor. The material gas is guided to the reactor through these members. The reactor, to which the material gas is introduced, includes: an inlet which communicates with the reactor and into which the material gas from the upstream side flows; an outlet which is located above the inlet and closer to the reactor than the located of the inlet, and reaches inside the reactor; a passage connecting the inlet and the outlet; and a step portion located inside the passage. The material gas guided from the insert to the inlet of the reactor climbs over the step portion in the passage that reaches inside the reactor, and is guided into the reactor. The guided material gas is caused to react on the substrate, whereby an epitaxial layer is grown on the substrate. The gas generated through reaction of the material gas in the reactor and the unreacted material gas are discharged from the reactor by the gas discharging mechanism.

In order to grow an epitaxial layer whose film thickness distribution is made more uniform by using the single-wafer-processing-type vapor phase growth apparatus as described above, it is most important to guide uniform flow of the material gas onto the surface of the substrate in the reactor. In the present single-wafer-processing-type vapor phase growth apparatus, the flow of the material gas once introduced into the cap is changed to desired flow by the baffle, and then the material gas flows into the plurality of (e.g., ten) flow paths in the insert. However, the flow of the material gas itself, formed through the baffle is dominated by pressure balance in the cap, so that the speed corresponding to the diameter of each through-hole of the baffle cannot be obtained. Furthermore, since the flow of the material gas finely divided through the baffle passes through the insert to be guided onto the substrate, the flow of the material gas depends on the number of the flow paths in the insert. Therefore, variations in speed corresponding to the number (e.g., 10) of the flow paths of the insert are caused in the material gas that flows in the in-plane direction of the substrate, and speed distribution of the material gas introduced onto the substrate is determined based on the situation. Meanwhile, the material gas introduced into the inlet of the reactor climbs over the step portion in the passage communicating with the reactor, and is guided into the reactor. Thus, the flow of the material gas is influenced by the shape of the step portion. Specifically, the step portion located in the passage includes: a first surface which curves like an arc around an axis extending in the vertical direction on the reactor side, and opposes the inlet of the passage; and a second surface extending from an upper end of the first surface to the outlet of the passage. Therefore, the flow of the material gas introduced into this passage is biased outward in the width direction of the passage due to the first surface when the material gas is about to climb over the step portion. Accordingly, the speed distribution of the material gas, which has been controlled outside the reactor, is changed before the material gas is introduced into the reactor, which makes it difficult to minutely control the speed distribution of the material gas introduced onto the substrate. Because of the structural restriction on the vapor phase growth apparatus and the difficulty in controlling the speed distribution of the material gas, it is difficult to satisfy evenness of the film thickness distribution of the epitaxial layer needed in the epitaxial wafer used for advanced device.

In order to satisfy evenness of film thickness distribution, the shape of a top dome, which is one of components constituting a ceiling of the reactor, has been optimized. This optimization results in overall improvement of the film thickness distribution in the epitaxial layer grown on the substrate. However, the speed of the material gas, which is introduced through the insert in the in-plane direction of the substrate, still has a plurality of variations corresponding to the flow paths in the insert. If an epitaxial layer is grown by the material gas having such variations in speed on, for example, a substrate rotating around the axis extending in the vertical direction, the variations in the speed of the material gas causes concentric variations in the film thickness of the epitaxial layer. Since an epitaxial wafer having such variations in film thickness cannot satisfy the required flatness, it is necessary to reduce the variations in the speed of the material gas supplied onto the substrate.

Therefore, the flow paths formed in the cap have been improved to make the speed of the material gas introduced onto the substrate uniform. For example, as for flow paths, in a cap, communicating with a plurality of outlets located on the downstream side (reactor side) of the cap, flow paths joined in a tournament-tree shape toward the upstream side of the cap are adopted, as described in Patent Document 1. Thus, the material gas is distributed while flowing from the upstream side toward the downstream side in the cap, whereby variations in the speed of the material gas supplied from the respective outlets of the cap can be improved. As a result, film thickness distribution of the epitaxial layer grown on the substrate is effectively improved.

However, when a cap having flow paths in a tournament-tree shape as described in Patent Document 1 is manufactured, advanced techniques, such as shaving of a stainless-steel material and diffusion bonding, are required, resulting in an increase in cost. When such a cap is used, another component corresponding to the cap is required. For example, an insert having flow paths as many as the tournament tree-shaped flow paths of the cap is required. In addition, it is necessary to extensively modify the components constituting the passage (the passage having the step portion) communicating with the inside of the reactor into which the material gas is introduced from the insert. Along with this modification, the top dome, which is a component constituting the ceiling of the reactor, needs to be modified, and moreover, a base ring, which is a component to be a base of the reactor, needs to be modified. In addition, when the base ring is modified, man-hours for lifting the base ring up and down are also needed. Therefore, when a cap having tournament tree-shaped flow paths as described in Patent Document 1 is used, much cost and labor are required for manufacture and replacement of necessary components. Some of vapor phase growth apparatuses to be operated do not manufacture a high-quality epitaxial wafer used for advanced device. Therefore, such a cap requiring much cost and labor cannot be easily applied to all vapor phase growth apparatuses.

Meanwhile, in Patent Documents 2 and 3, a quartz member, which is relatively easy to be machined, is used as a member for guiding material gas into a reactor.

CITATION LIST

Patent Document

Patent Document 1: Japanese Laid-Open Patent Publication No. 2009-277730
Patent Document 2: Japanese Laid-Open Patent Publication No. 2007-12664
Patent Document 3: Japanese Laid-Open Patent Publication No. 2003-168650

SUMMARY OF INVENTION

Problems to be Solved by the Invention

In Patent Documents 2 and 3, however, since a material gas flow path for supplying a material gas to the reactor is not formed in a tournament-tree shape, variations in speed of the material gas supplied into the reactor cannot be effectively improved.

An object of this invention is to provide a vapor phase growth apparatus, a method of manufacturing an epitaxial wafer, and an attachment for the vapor phase growth apparatus which are able to improve uniformity of the film thickness of an epitaxial layer grown on a substrate, with high cost effectiveness.

Solution to the Problems

A vapor phase growth apparatus according to this invention includes: a reactor having an inlet through which a material gas is introduced, and being configured to grow an epitaxial layer on a substrate by using the material gas; a plurality of flow paths which extend from the inlet to an outside of the inlet, and guide the material gas to the reactor; an injection cap having an introduction passage which guides the material gas toward the plurality of flow paths; and an attachment made of quartz, the attachment having a connection path connectable to the introduction passage, and being attachable to the injection cap. The connection path is connected to the introduction passage while the attachment is attached to the injection cap. The connection path is branched so as to correspond to the plurality of flow paths, in a tournament-tree shape from a side where the introduction passage is present toward a downstream side of the material gas, and the branched paths are connected to the corresponding flow paths.

According to the vapor phase growth apparatus of this invention, since the connection path of the attachment is branched in a tournament-tree shape from the upstream side toward the downstream side, the speeds of the material gas flowing through the respective branched flow paths can be effectively made uniform. Therefore, the speed of the material gas introduced onto the substrate is made uniform, and uniformity of the film thickness of the epitaxial layer grown on the substrate can be improved. In addition, since the attachment attached to the injection cap is made of quartz, the cost can be reduced as compared with that in the case where tournament tree-shaped flow paths are formed in an injection cap itself made of stainless steel, for example. Therefore, uniformity of the film thickness of the epitaxial layer grown on the substrate can be improved with high cost effectiveness. In this specification, the "tournament-tree shape" means the overall shape of lines branching from the uppermost stage toward points located at the lowermost points in the lowermost stage, in a tournament chart having a perfect binary tree structure (even single elimination tournament chart).

According to an embodiment of this invention, the injection cap is made of stainless steel.

Since the injection cap and the attachment are formed from different materials, the cost for fabricating the components of the vapor phase growth apparatus can be reduced.

According to the embodiment of this invention, the number of the plurality of flow paths is a power of 2 in total.

Since the connection path of the attachment is branched in a tournament-tree shape from the upstream side toward the downstream side to provide a plurality of flow paths as many as a power of 2 in total, the speeds of the material gas flowing through the respective flow paths can be effectively made uniform. Therefore, the speed of the material gas to be introduced onto the substrate is made uniform, whereby uniformity of the film thickness of the epitaxial layer grown on the substrate is improved.

According to the embodiment of this invention, the number of the plurality of flow paths is not less than 32.

This configuration is effective for further improving the uniformity of the film thickness of the epitaxial layer grown on the substrate.

According to the embodiment of this invention, an epitaxial layer is grown on a substrate by using the vapor phase growth apparatus described above.

Therefore, an epitaxial wafer with satisfactory film thickness uniformity can be manufactured with high cost effectiveness.

An attachment for a vapor phase growth apparatus according to this invention is an attachment for a vapor phase growth apparatus including: a reactor having an inlet through which a material gas is introduced, and being configured to grow an epitaxial layer on a substrate by using the material gas; a plurality of flow paths which extend from the inlet to an outside of the inlet, and guide the material gas to the reactor; and an injection cap having an introduction passage which guides the material gas toward the plurality of flow paths. The attachment is attachable to the injection cap of the vapor phase growth apparatus. The attachment is made of quartz. The attachment includes a connection path connectable to the introduction passage while the attachment is attached to the injection cap. The connection path is branched so as to correspond to the plurality of flow paths, in a tournament-tree shape from a side where the introduction passage is present toward a downstream side of the material gas, and the branched paths are connected to the corresponding flow paths.

The attachment for the vapor phase growth apparatus according to this invention is also able to improve uniformity of the film thickness of an epitaxial layer grown on a substrate with high cost effectiveness.

BRIEF DESCRIPTION OF THE DRAWINGS

FIG. 2A is a schematic cross-sectional view showing an injection cap shown in FIG. 1B.

FIG. 2B is a schematic cross-sectional view showing an attachment shown in FIG. 1B.

FIG. 2C is a schematic cross-sectional view in which the attachment shown in FIG. 2B is attached to the injection cap shown in FIG. 2A.

FIG. 3A is a schematic front view showing an injection insert shown in FIG. 1B.

FIG. 3B is a IIIB-IIIB schematic cross-sectional view of FIG. 3A.

DESCRIPTION OF EMBODIMENTS

Figure 1A:
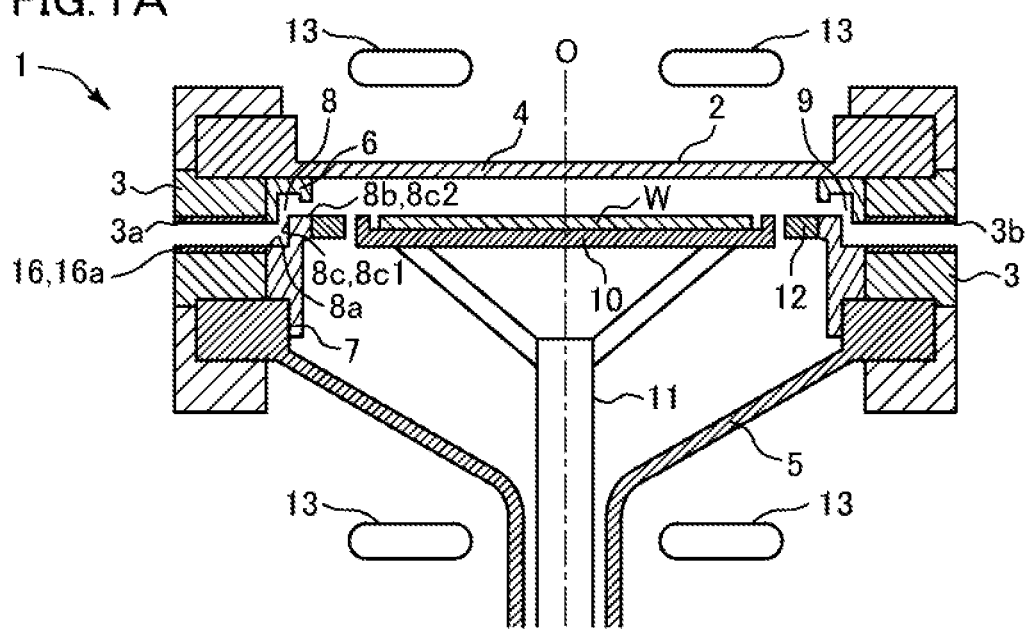
FIG. 1A is a schematic cross-sectional view showing a part of a vapor phase growth apparatus according to an embodiment of the invention.

FIG. 1A shows a single-wafer-processing-type vapor phase growth apparatus 1 according to an embodiment of this invention. An epitaxial layer is grown in a vapor phase on a substrate W by a vapor phase growth apparatus 1, whereby an epitaxial wafer is manufactured.

Figure 1B:
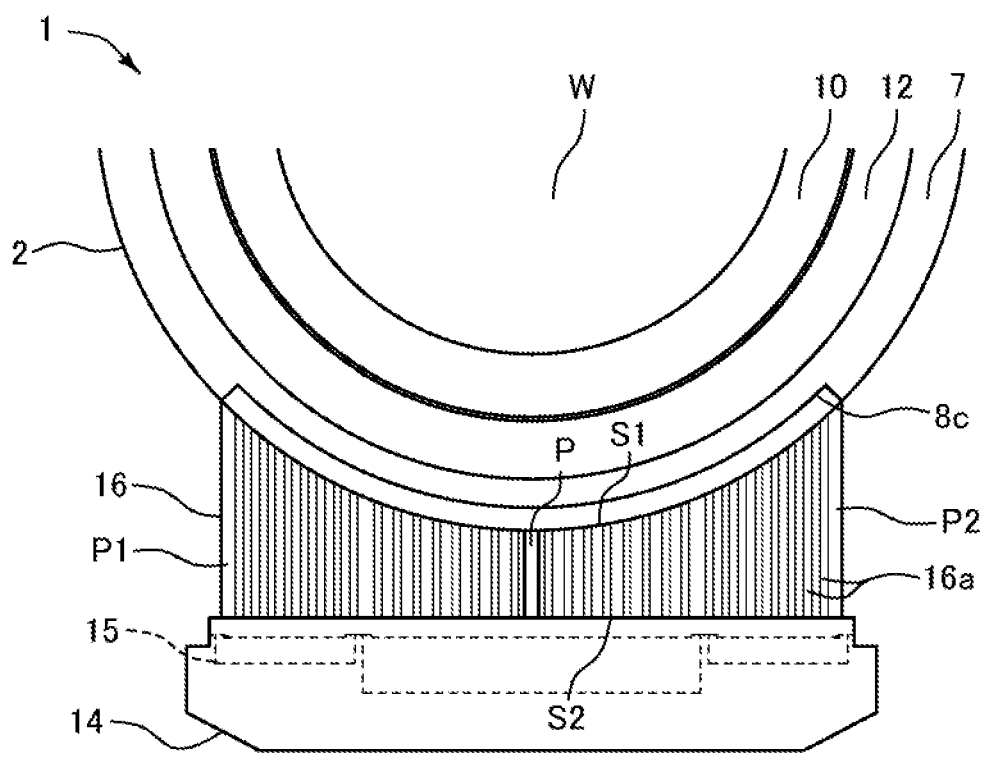
FIG. 1B is a planar schematic diagram showing a member through which gas passes toward a substrate of the vapor phase growth apparatus shown in FIG. 1A.

The vapor phase growth apparatus 1 includes a reactor 2 which houses a substrate W. The reactor 2 is formed in a vessel shape. The reactor 2 includes: a cylindrical or annular base ring 3; an upper dome 4 which closes the base ring 3 from the upper side to form a ceiling of the reactor 2; and a lower dome 5 which closes the base ring 3 from the lower side to form a bottom of the reactor 2. The reactor 2 has a pillar portion P which increases the strength of the reactor 2 as shown in FIG. 1B. The pillar portion P extends outward from the reactor 2.

Referring back to FIG. 1A, the base ring 3 is a member that forms a base constituting the reactor 2. The base ring 3 includes: an introduction port $3a$ through which gas is introduced into the base ring 3; and a discharge port $3b$ through which the gas inside the base ring 3 is discharged from the base ring 3. Each of the introduction port $3a$ and the discharge port $3b$ is formed as a curved opening, in other words, an arch-shaped opening, of an arc centering around, for example, an axis O extending in the vertical direction, which is a center line of the base ring 3. The width of each of the introduction port $3a$ and an introduction passage 8 described later, in a direction perpendicular to the surface of the sheet of FIG. 1A, i.e., a direction perpendicular to both a gas flow direction at the surface of the substrate W (right-left direction of the surface of the sheet of FIG. 1A) and the direction of the axis O (up-down direction of the surface of the sheet of FIG. 1A), is not less than the diameter of the substrate W and not greater than the outer diameter of a preheating ring 12 described later.

An upper liner 6 and a lower liner 7 are located inside the base ring 3. The upper liner 6 and the lower liner 7 are components for forming an introduction passage 8 which guides the gas from the introduction port $3a$ into the reactor 2, and a discharge passage 9 which guides the gas in the reactor 2 to the discharge port $3b$ through which the gas is discharged from the reactor 2.

The upper liner 6 is formed in an annular shape so as to be fitted to the inner circumference of the base ring 3. The upper liner 6 is located on the upper dome 4 side while being fitted inside the base ring 3.

The lower liner 7 is formed in an annular shape so as to be fitted inside the base ring 3. The lower liner 7 is disposed on the lower dome 5 while being fitted inside the base ring 3.

The introduction passage 8, which is formed by the upper liner 6 and the lower liner 7, is a passage including: an inlet $8a$ communicating with the inside of the reactor 2; and an outlet $8b$ which is located above the inlet $8a$ and closer to the reactor 2 than the located of the inlet $8a$, and reaches into the reactor 2. The introduction passage 8 connects the inlet $8a$ and the outlet $8b$. The introduction passage 8 includes a step portion $8c$ located inside the passage connecting the inlet $8a$ and the outlet $8b$. The inlet $8a$ is formed in a curved-plane-shaped opening of an arc centering around the axis O so as to correspond to the introduction port $3a$ of the base ring 3. The step portion $8c$ includes a first surface $8c1$ opposing the inlet $8a$, and a second surface $8c2$ extending from an upper end of the first surface $8c1$ to the outlet $8b$. The first surface $8c1$ is a curved surface of an arc centering around the axis O, and the second surface $8c2$ is a horizontal surface. Since the discharge passage 9 formed by the upper liner 6 and the lower liner 7 is similar to the introduction passage 8, description thereof is omitted.

Inside the reactor 2, a susceptor 10 on which a substrate W is placed, a support member 11 supporting the susceptor 10, and a preheating ring 12 surrounding the susceptor 10, are disposed. The support member 11 is rotatable around the axis O by a driving means (not shown).

As shown in FIG. 1A, lamps 13 serving as heating sources are disposed externally above and beneath the reactor 2. A mechanism for supplying gas into the reactor 2 and a mechanism for discharging the gas from the reactor 2 are disposed externally on the right and left of the reactor 2. The gas supplying mechanism and the gas discharging mechanism are partially omitted in FIG. 1A.

FIG. 1B is a schematic diagram for explaining a mechanism which supplies various gases for growing an epitaxial layer on a substrate W. FIG. 1B is a planar schematic diagram showing components through which gas passes toward the substrate W. The supplied gas passes through an injection cap 14 (hereinafter referred to as "cap 14") at the lower side in FIG. 1B, an attachment 15, an injection insert 16 (hereinafter referred to as "insert 16"), the lower liner 7, the preheating ring 12, and the susceptor 10 in this order, to reach the substrate W. In FIG. 1B, each of the substrate W, the susceptor 10, the preheating ring 12, and the lower liner 7 is shown in a semi-circular shape.

The cap 14 is a member to which the gas to be supplied onto the substrate W is introduced via a mass flow controller (not shown). The gas introduced into the cap 14 is guided from the cap 14 to the attachment 15. The cap 14 is made of stainless steel, and is an injection cap which is a commercially available genuine product. As shown in FIG. 2A, the cap 14 includes: an introduction passage 14a to which the supplied gas is introduced by the mass flow controller; and an attachment part 14b to which a part of the attachment 15 is fitted and attached.

The attachment 15 shown in FIG. 2B is a member which is made of quartz and is attachable to and detachable from the cap 14. The attachment 15 includes: branch paths 15a for distributing the gas introduced from the introduction passage 14a (FIG. 2A); and an attachment part 15b to be attached to the cap 14 (FIG. 2A). The branch paths 15a are separated into three groups, and only the center group is configured as a tournament tree-shaped flow path F having one more branch than the other groups. In each tournament tree-shaped flow path F, branch flow paths B are located at the lowermost points in the lowermost stage. The number of the branch flow paths B is a power of 2 (32) with respect to all the branch paths 15a. The attachment part 15b is a part for attaching the attachment 15 to the cap 14 as shown in FIG. 2C. The attachment part 15b is fitted in the attachment part 14b, whereby the attachment 15 is attached to the cap 14. With the attachment 15 being attached to the cap 14, the introduction passage 14a of the cap 14 is connected to the upstream side of the branch paths 15a (the flow paths located at the uppermost stage of the tournament-tree shape), whereby the gas is allowed to flow from the cap 14 to the attachment 15. The attachment 15 attached to the cap 14 can be detached from the cap 14. Each branch path 15a corresponds to a "connection path" of this invention.

FIG. 3A and FIG. 3B are schematic diagrams showing the insert 16. As shown in FIG. 3B, the insert 16 has a pair of flat plates P1, P2 each having an arc-shaped side S1 and an opposing side S2 which opposes the side S1. Each of the plates P1, P2 includes a plurality of flow paths 16a which linearly penetrate the plate from the opposing side S2 toward the side S1. The plates P1, P2 each have the same number of flow paths 16a. The plates P1, P2 are disposed with a gap therebetween. As shown in FIG. 1B, the pillar portion P extends from the reactor 2 toward the gap between the pair of plates P1, P2 so as to be sandwiched between a pair of flow paths 16a. Throughout the two plates P1, P2, the flow paths 16a as many as the branch flow paths B shown in FIG. 2C are formed. One end of each flow path 16a communicates with the corresponding branch flow path B, while the other end communicates with the inlet 8a of the introduction passage 8 as shown in FIG. 1A. Each flow path 16a extends in the horizontal direction from the inlet 8a of the introduction passage 8 toward the outside of the inlet 8a (outside of the reactor 2). At least a part of the insert 16 is inserted in the introduction port 3a and attached to the reactor 2. As shown in FIG. 1B, the plurality of flow paths 16a are disposed in parallel along the horizontal surface.

After passing through the cap 14, the attachment 15, and the insert 16 described above, the gas is supplied to the substrate W through the lower liner 7, the preheating ring 12, and the susceptor 10. For example, during vapor phase growth, a vapor phase growth gas is supplied into the reactor 2. The vapor phase growth gas contains, for example, a material gas as a raw material of a silicon single-crystal film, a carrier gas that dilutes the material gas, and a dopant gas that gives a conductivity type to the single-crystal film.

The major components of the vapor phase growth apparatus 1 have been described above. When an epitaxial layer is grown on the substrate W by using the vapor phase growth apparatus 1 to manufacture an epitaxial wafer, first, the substrate W is placed on the susceptor 10 in the reactor 2. Then, the vapor phase growth gas, whose flow rate is controlled by a mass flow controller (not shown), is supplied toward the reactor 2. Then, the vapor phase growth gas is guided to the uppermost stage of the tournament tree-shaped flow paths F, separated into three groups, of the attachment 15, via the introduction passage 14a of the cap 14 shown in FIG. 2C, and the vapor phase growth gas is distributed from the uppermost stage toward the respective branch flow paths B. Finally, the vapor phase growth gas is separated into 32 pieces of flow (branch flow paths B) to be introduced into the corresponding 32 flow paths 16a in the insert 16 shown in FIG. 1B. Then, the vapor phase growth gas having passed through the flow paths 16a is supplied into the reactor 2 through the introduction passage 8 shown in FIG. 1A. Thus, the supplied vapor phase growth gas contributes to vapor phase growth of a silicon single-crystal thin film on the substrate W, thereby manufacturing a silicon epitaxial wafer.

In the embodiment of this invention, the branch paths 15a shown in FIG. 2C, through which the vapor phase growth gas flows from the upstream side to the downstream side thereof, are branched into 32 branch flow paths B in a tournament-tree shape, and the branch flow paths B are connected to the corresponding flow paths 16a in the insert 16 shown in FIG. 1B. Therefore, the speeds of the vapor phase growth gas flowing through the plurality of flow paths 16a can be effectively made uniform. Thus, the speed of the vapor phase growth gas introduced onto the substrate W is made uniform, whereby uniformity of the film thickness of the epitaxial layer grown on the substrate W can be improved. In addition, since the attachment 15 attached to the cap 14 is made of quartz, the cost can be reduced to about ¼ as compared with that in the case where tournament tree-shaped flow paths as the attachment 15 are formed in the cap 14 itself made of stainless steel. Therefore, uniformity of the film thickness of the epitaxial layer grown on the substrate W can be improved with high cost effectiveness. In particular, this invention can be advantageously applied to vapor phase growth onto a substrate W having a diameter not less than 200 mm, as described in "Examples" below.

Examples

The effects of this invention were confirmed through an experiment below. Hereinafter, the invention will be specifically described with an example and a comparative example. However, the example and the comparative example do not limit the invention.

Example

In this example, an epitaxial wafer was manufactured by using a silicon single-crystal substrate having a diameter of 300 mm and a crystal plane orientation (100) in the vapor phase growth apparatus 1, and film thickness distribution of the manufactured epitaxial wafer was measured. In measuring the film thickness distribution, film thicknesses were measured at 33 measuring points along the diameter direction of the manufactured wafer, excluding a region within 5 mm from the edge of the wafer. Then, based on the measured film thicknesses, film thickness uniformity (%) and film thickness variation (%) described below were calculated, thereby obtaining film thickness distribution of the epitaxial wafer. The film thickness uniformity (%) was calculated based on the maximum film thickness and the minimum film thickness obtained through the measurement. Specifically, a value obtained by subtracting the minimum film thickness from the maximum film thickness was divided by a value obtained by summing the maximum film thickness and the minimum film thickness, and the resultant value was multiplied by 100 to obtain a value representing the film thickness uniformity (%). The film thickness variation (%) was obtained as follows. That is, a film thickness measured at one measuring point was divided by an average value of the film thicknesses measured at the 33 measuring points. Then, a value obtained by subtracting 1 from the above resultant value was multiplied by 100. Then, 100 was subtracted from the above calculated value to obtain a value representing the film thickness variation (%).

Comparative Example

Figure 4:
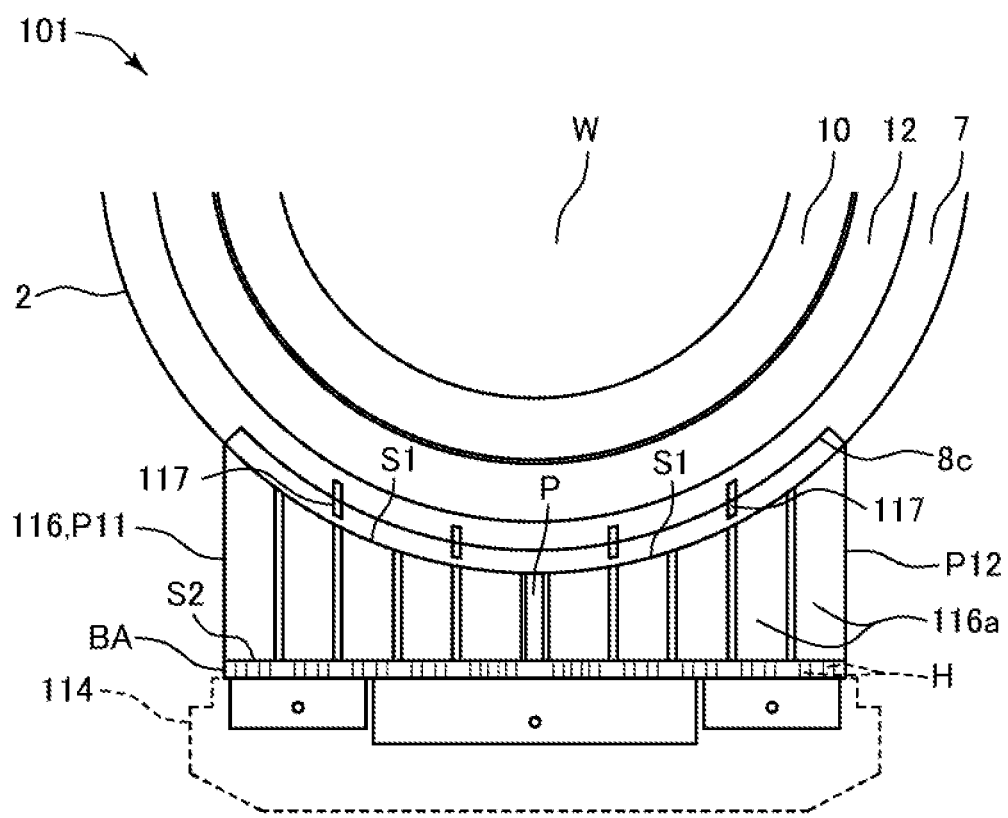
FIG. 4 is a schematic cross-sectional view corresponding to FIG. 1B, showing an example of a vapor phase growth apparatus according to a comparative example.

In the comparative example, an epitaxial wafer was manufactured and film thickness distribution of the epitaxial wafer was measured in a similar manner to that of the above example, except that the conventional vapor phase growth apparatus 101 shown in FIG. 4 was used. Hereinafter, the vapor phase growth apparatus 101 will be specifically described. The same components as those in the vapor phase growth apparatus 1 are designated by the same reference numerals, and the description thereof is omitted. The vapor phase growth apparatus 101 includes an injection cap 114 (hereinafter referred to as "cap 114"), a baffle BA, an injection insert 116 (hereinafter referred to as "insert 116"), and partition plates 117, instead of a cap 14, an attachment 15, and an insert 16. The cap 114 has a space (not shown) through which a vapor phase growth gas passes when the vapor phase growth gas is introduced into the reactor 2. The baffle BA is a plate-shaped member sandwiched and located between the cap 114 and the insert 116, and has a plurality of through-holes H which guide the vapor phase growth gas from the cap 114 to the insert 116. The through-holes H adjust the flow of the vapor phase growth gas toward the insert 116. The insert 116 is formed as two plates P11, P12 each having an arc-shaped side S1 and an opposing side S2 which opposes the side S1. The insert 116 includes a plurality of flow paths 116a penetrating the insert 116 from the opposing side S2 toward the side S1. Each of the plates P11, P12 has five flow paths 116a, and the plates P11, P12 are disposed with a gap therebetween. A pillar portion P extends from the reactor 2 toward the gap between the plates P11, P12 so as to be sandwiched between a pair of flow paths 116a. The partition plates 117 are plate-shaped members for partitioning the flow of gas flowing from the insert 116 to the reactor 2. Four partition plates 117 are disposed. In this comparative example, the vapor phase growth apparatus 101 is identical to the vapor phase growth apparatus 1 except for the above components.

Figure 5A:
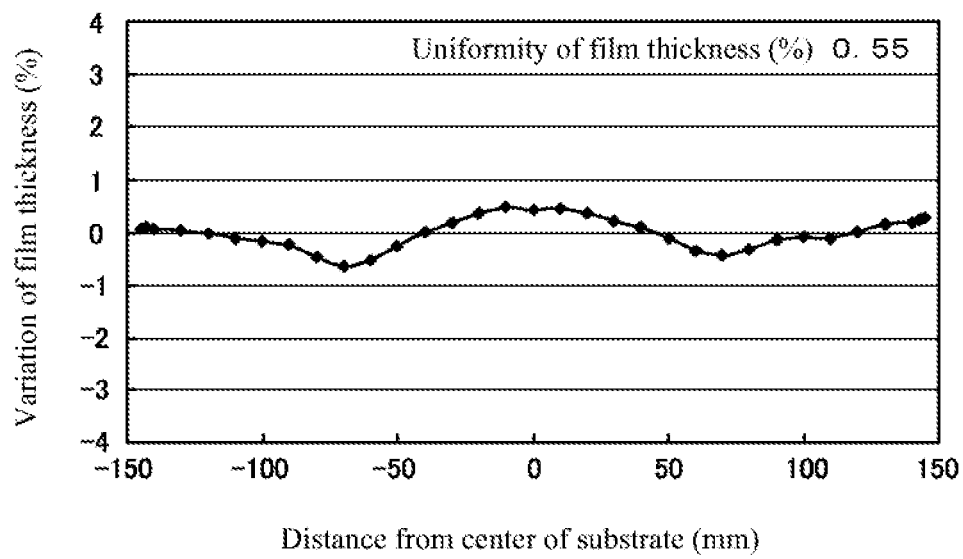
FIG. 5A is a graph showing film thickness distribution, of an epitaxial wafer, measured according to an example of the invention.
Figure 5B:
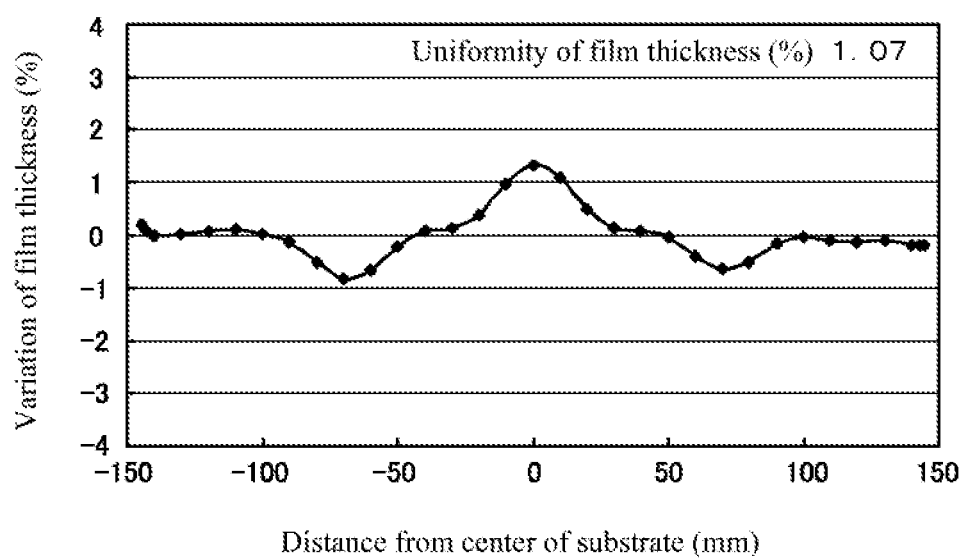
FIG. 5B is a graph showing film thickness distribution of an epitaxial wafer, measured according to the comparative example.

When the vapor phase growth gas to be supplied onto the substrate W was branched into 32 flow paths in a tournament-tree shape and guided onto the substrate W as in the example, satisfactory film thickness uniformity and film thickness variation were obtained as shown in FIG. 5A. Specifically, the film thickness uniformity was 0.55. The film thickness variation was smoothed. In contrast, when the conventional vapor phase growth apparatus 101, in which a vapor phase growth gas to be supplied onto the substrate W was not branched in a tournament-tree shape before being introduced onto the substrate W, was used as in the comparative example, film thickness uniformity and film thickness variation were not satisfactory as shown in FIG. 5B. Specifically, the film thickness uniformity was 1.07, and the film thickness variation was not sufficiently smoothed. Thus, in the example, uniformity of film thickness distribution was improved to a value about half the value of the comparative example.

Although the embodiment of the invention has been described above, the invention is not limited to the specific description thereof, and the illustrated configurations and the like can be combined as appropriate within a range where there is no technical contradiction, to practice the invention, or a certain element or process can be substituted with a known form to practice the invention.

DESCRIPTION OF THE REFERENCE CHARACTERS 1 vapor phase growth apparatus
2 reactor
3 base ring
6 upper liner
7 lower liner
8 introduction passage (passage)
8a inlet
8b outlet
8c step portion
8c1 first surface
8c2 second surface
10 susceptor
14 injection cap
14a introduction passage
14b attachment part
15 attachment
15a branch path
15b attachment part
16 injection insert
16a flow path
W substrate

The invention claimed is:
1. A vapor phase growth apparatus comprising:
a reactor having an inlet through which a material gas is introduced, and being configured to grow an epitaxial layer on a substrate by using the material gas;
a plurality of flow paths which extend from the inlet to an outside of the inlet, and guide the material gas to the reactor;
an injection cap having an introduction passage which guides the material gas toward the plurality of flow paths; and an attachment made of quartz, the attachment having a connection connectable to the introduction passage, and being attachable to the injection cap, wherein the connection path is connected to the introduction passage attachment is attached to the injection cap, and the connection path is branched so as to correspond to the plurality of flow paths, in a tournament-tree shape from a side where the introduction passage is present toward a downstream side of the material gas, and the branched paths are connected to the corresponding flow paths.

2. The vapor phase growth apparatus according to claim wherein the injection cap is made of stainless steel.

3. The vapor phase growth apparatus according to claim 1, wherein the number of the plurality of flow paths is a power of 2 in total.

4. The vapor phase growth apparatus according to claim 1, wherein the number of the plurality of flow paths is not less than 32.

5. A method of manufacturing an epitaxial wafer, including growing an epitaxial layer on a substrate by using a vapor phase growth apparatus according to claim 1.

6. An attachment for a vapor phase growth apparatus, the vapor phase growth apparatus comprising:

a reactor having an inlet through which a material gas is introduced, and being configured to grow an epitaxial layer on a substrate by using the material gas;

a plurality of flow paths which extend from the inlet to an outside of the inlet, and guide the material gas, to the reactor; and an injection cap having an introduction passage which guides the material gas toward the plurality of flow paths, the attachment being attachable to the injection cap of the vapor phase growth apparatus, wherein the attachment is made of quartz, the attachment includes a connection path connectable to the introduction passage while the attachment is attached to the injection cap, and the connection is branched so as to correspond to the plurality of flow paths, in a tournament-tree shape from a side where the introduction passage is present toward a downstream side of the material gas, and the branched paths are connected to the corresponding flow paths.

* * * * *